United States Patent
Plesant

(10) Patent No.: US 7,848,911 B2
(45) Date of Patent: Dec. 7, 2010

(54) METHOD OF DETERMINING MEASUREMENT UNCERTAINTIES USING CIRCUIT SIMULATION

(75) Inventor: Daniel L. Plesant, Santa Rosa, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 1603 days.

(21) Appl. No.: 10/783,645

(22) Filed: Feb. 20, 2004

(65) Prior Publication Data

US 2005/0187743 A1      Aug. 25, 2005

(51) Int. Cl.
G06F 17/50 (2006.01)
(52) U.S. Cl. ............................................. 703/13; 716/4
(58) Field of Classification Search .................. 703/1, 703/2, 13; 702/85, 107; 714/724
See application file for complete search history.

(56) References Cited

U.S. PATENT DOCUMENTS

| | | | | |
|---|---|---|---|---|
| 6,118,844 | A * | 9/2000 | Fischer | 378/48 |
| 6,178,389 | B1 * | 1/2001 | Sola et al. | 702/152 |
| 6,804,807 | B2 * | 10/2004 | Jamneala et al. | 716/4 |
| 6,820,499 | B2 * | 11/2004 | Brockhaus | 73/861.17 |
| 6,874,241 | B2 * | 4/2005 | Och | 33/501.19 |
| 2005/0174562 | A1 * | 8/2005 | Cedilnik | 356/73.1 |

OTHER PUBLICATIONS

Piratelli-Filho et al. (Uncertainty Evaluation in small angle Calibration using ISO GUM Approach and Monte Carlo Method, Jun. 2003).*
Argilent ADS (Harmonic Balance Simulation on ADS, Jan. 2003).*
Helisto et al. (Measurement Uncertainty in the 1/f noise region: Zener Voltage Standards, IEEE 2000).*
Anritsu (Application Note: Three and Four Port S-parameter Measurements, Apr. 2002).*
Agilent 85123A RF Precision Modeling System, Installation and User's Guide, 2002.*

* cited by examiner

*Primary Examiner* — Paul L Rodriguez
*Assistant Examiner* — Andre Pierre Louis

(57) ABSTRACT

A method of determining a measurement uncertainty of a test system uses a test system model having a plurality of uncertainty terms entered into a simulator. The test system model is run on the simulator a sufficient number of iterations while randomly varying each of a first portion of the plurality of uncertainty terms within probability distributions to produce a statistically significant number of results of a selected parameter. The results are evaluated to determine a measurement uncertainty of the selected parameter.

16 Claims, 3 Drawing Sheets

_US 7,848,911 B2_

METHOD OF DETERMINING MEASUREMENT UNCERTAINTIES USING CIRCUIT SIMULATION

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO MICROFICHE APPENDIX

Not applicable.

BACKGROUND OF THE INVENTION

Many test systems require periodic calibration to insure that the measurements made by the test system are accurate. Although system calibration can significantly reduce systemic or "bias" errors, other uncertainties arise that can not be calibrated out, and arise in a somewhat random fashion when testing electronic devices. In high-frequency test systems, measurement uncertainties often arise from impedance mismatches between components of the test system and from other sources, such as temperature stability, aging, noise, and accuracy and repeatability of the test instruments in the test system. Uncertainties from multiple sources can add to or subtract from each other to create a total measurement uncertainty for a measurement made by the test system.

In many cases, the measurement uncertainty of a test system or instrument is required to be reported along with the measured calibration and/or test values. Standards have been developed for calculating and reporting measurement uncertainties. The International Organization for Standards ("ISO") provides specifications (e.g. ISO 17025) for making measurements and reporting uncertainties in a particular fashion. Therefore, knowing the uncertainty of a measured value is very important, and sometimes required.

Calibration of high-frequency electronic test equipment and test systems is often done automatically or semi-automatically. Computer software controls the electronic test equipment and can include mathematical equations that calculate the associated measurement uncertainty ("uncertainty calculations") to provide the test result and associated measurement uncertainty in the desired format. These uncertainty calculations are conventionally derived by a highly trained metrologist who examines the specific test system being used and develops an uncertainty calculation based on the instrumentation and topography of the test system. This process can take several days.

If a test instrument in the test system is replaced, the values of uncertainties may change, but the form of the uncertainty calculations often do not. However, if the topography of the test system is changed, such as by adding or removing a switch in the signal path, then the form of the uncertainty equations changes and the metrological analysis must be re-validated by the metrologist, and the uncertainty calculation incorporated into the computer test software also must be changed.

Therefore, it is desirable to calculate measurement uncertainties for high-frequency test systems and instrumentation without manual metrological calculations.

BRIEF SUMMARY OF THE INVENTION

A model of a test system including uncertainty terms is developed and entered into a simulator. A statistically significant number of iterations of the test system model are run for a selected parameter (test value) while varying uncertainty terms within a probability distribution, which produces a distribution of test values. The measurement uncertainty for a selected parameter is calculated from the distribution of test values.

DETAILED DESCRIPTION OF THE EMBODIMENTS

I. Introduction

Uncertainties associated with measurements made by electronic test systems are determined by simulating the operation of the test system on a simulator. In some embodiments, Monte Carlo analysis is used with a model of the test system run on a circuit simulator. The test system model is run many times, varying the values of elements in the model that affect measurement uncertainty, to generate a statistical distribution of test results. The measurement uncertainties are derived from the statistical distribution of the test results.

Circuit simulators are easily reconfigured to describe the performance of a test system topology, and changes to test equipment configurations can be handled in software. Similarly, once models for each instrument in a test system have been developed, the circuit simulator is capable of calculating measurement uncertainties without the need for manual derivation of mathematical equations. This means that measurement uncertainties can be handled almost entirely by software, without the need for highly trained metrologists to develop uncertainty equations. A test technician typically only needs to make minor changes to the test system model and re-run the circuit simulation analysis, which typically only takes a few seconds for a test system of normal complexity.

II. An Exemplary Test System

Figure 1:
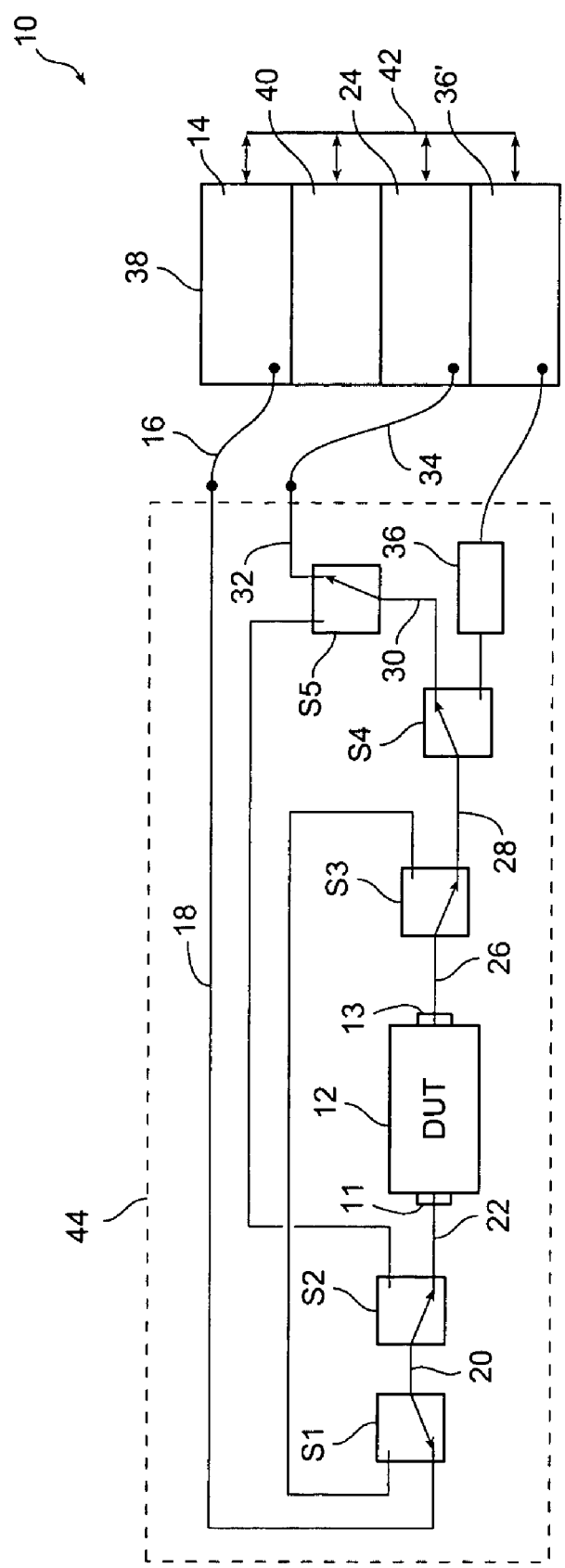
FIG. 1 shows a simplified diagram of an exemplary electronic test system.

FIG. 1 shows a simplified diagram of an exemplary electronic test system 10. An input 11 of a device under test ("DUT") 12, such as an amplifier, is connected to a source 14, such as an RF synthesizer, through cables 16, 18, 20, 22 and switches S1, S2. An output 13 of the DUT 12 is connected to a receiver 24, such as a spectrum analyzer, through cables 26, 28, 30, 32, 34 and switches S3, S4, S5. The switches allow switching the output 13 to other loads, such as a power meter head 36, the source 14 to the output 13, and generally allows the test system to be configured to perform a variety of measurements. A variety of DUTs, such as an attenuator, are alternatively tested, and alternative test systems are used to test even more types of DUTs, including mixers and even test instruments, such as spectrum analyzers.

The test system 10 includes a test rack 38 with the source 14, receiver 24, power meter 36', and a controller (computer) 40 that controls the other instruments over a bus 42, and also controls the switches in the test fixture 44. Alternative test systems have other instruments. Test systems and test fixtures can be much more complex, or more simple, than the illustrated example.

Deriving the measurement uncertainty calculations (equations) using conventional, manual methods is a tedious. The calculations use specified parameters of the components in test system, each of which typically has an associated uncertainty, to arrive at a measurement uncertainty. In an embodiment of the present invention, a model of the test system running on a circuit simulator establishes measurement uncertainty by varying the parameters of the components in the test system within their ranges of uncertainty. In some embodiments, the parameters are randomly varied within a probability distribution.

III. An Exemplary Simulation

Figure 2:
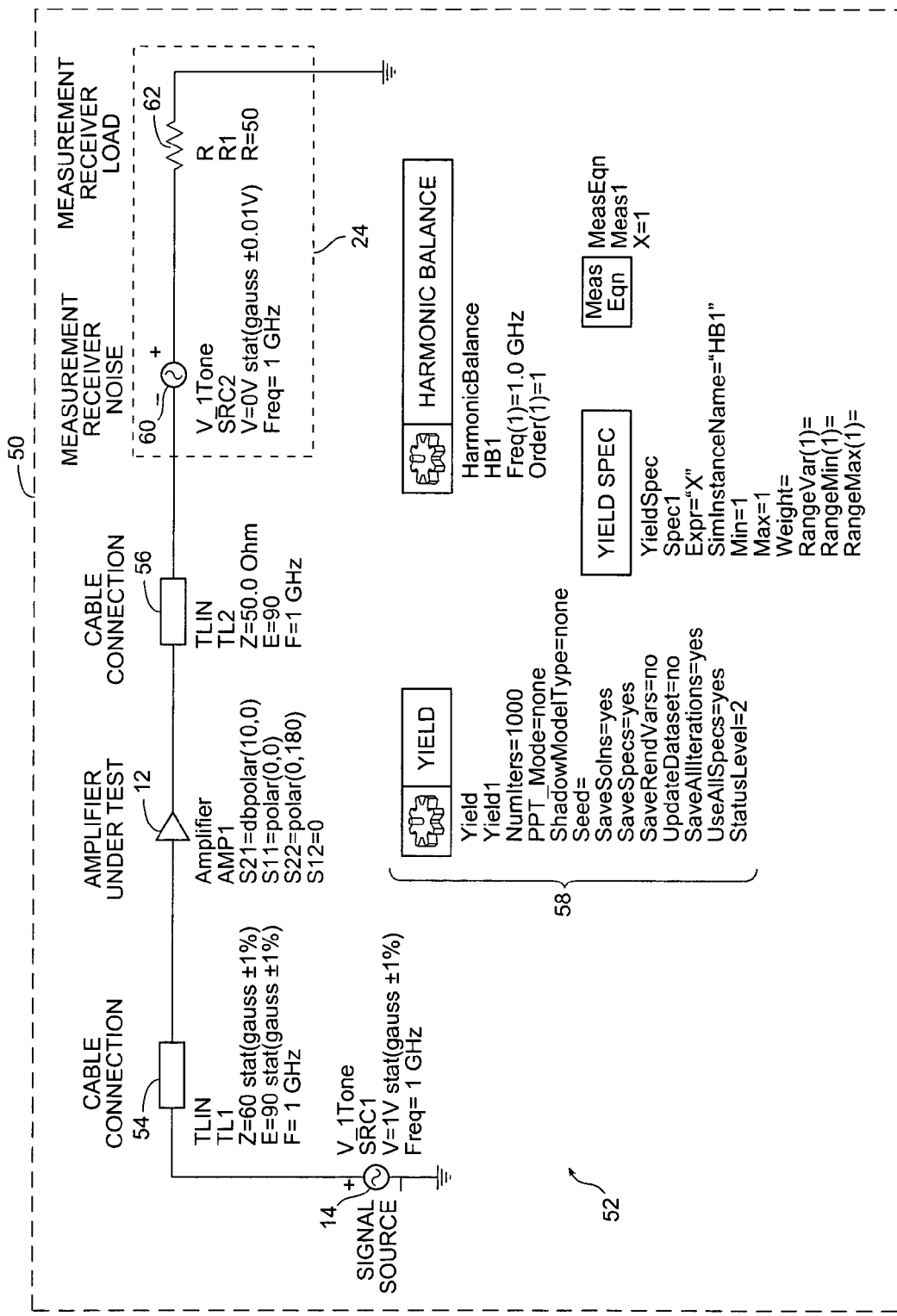
FIG. 2 shows an exemplary screen shot of a circuit simulator operated in accordance with an embodiment of the present invention.

FIG. 2 shows an exemplary screen shot 50 of a circuit simulator operated in accordance with an embodiment of the present invention. A simplified test system model 52 includes a numerical representation (model) of the source 14, DUT 12, and other components of a test system. The source 14 is connected to the DUT 12 with a transmission line 54 and the DUT 12 is connected to the receiver 24 with a transmission line 56. Alternatively, a test system model includes individual switches and cable segments, with their associated uncertainties, instead of simple transmission lines 54, 56. The topology of the test system model of FIG. 2 was created manually, but circuit simulation technology easily accepts automatically generated circuit/system specifications, enabling full automation of the modeling process.

Conventional manual techniques often ignore the contributions to measurement uncertainty made by components such as cables and switches for two reasons. First, the components typically have impedance close to fifty ohms, and thus contribute little to the overall uncertainty in some test systems. Second, including each component in a conventional uncertainty calculation quickly becomes unwieldy. However, a more accurate characterization of measurement uncertainty is obtained if all components of the system are included in a model of the test system for simulation. More accurate characterizations of measurement uncertainty are particularly desirable as operating parameters change, such as with an increase in frequency or a decrease in power, and/or for devices with stringent performance requirements (i.e. when typical performance limits are close to the specification limits).

The screen shot 50 is taken from an ADS™ ("Advanced Design System") circuit simulator available from AGILENT TECHNOLOGIES, INC., of Palo Alto, Calif., but several commercially available circuit simulators (generally known as "simulators"), such as SPICE simulators, are suitable for use in alternative embodiments of the invention. The ADS™ simulator used a harmonic balance analysis to perform the simulations in the frequency domain, but an ADS™ system can perform other types of analyses, such as analyses in the time domain, linear S-parameter analysis, Ptolemy analysis, and electromagnetic analysis. Linear S-parameter analysis is desirable when testing relatively simple, linear devices, such as attenuators, where most of the uncertainty arises from impedance mismatch, because S-parameter analysis is quick and efficient for such a simulation.

The screen shot shows the parameters entered into the test system model 52 for the various components, and the simulator settings 58. For example, the signal source 14 is modeled as providing a 1 GHz single tone of 1V (V=1) with a statistical Gaussian variation of ±1%. A Gaussian distribution is generally the default choice for performance variables because a component is probably closer to the nominal value than to the edge of a specification window. However, simulators can handle a variety of non-Gaussian distributions for performance variables. The first transmission line 54 has a nominal impedance of fifty ohms (Z=50) with a ±1% Gaussian variation, and an electrical length of ninety degrees (E=90). The test system model 52 is shown in a graphical user interface. Test system models used in alternative embodiments are expressed as a net list.

The transmission line and other test system components are modeled at 1 GHz, but could be modeled at other frequencies. The performance values and ranges of components in the test system model typically change with frequency, power, and other factors, such as system temperature. Modeling a test system on a circuit simulator allows one to easily determine measurement uncertainty under several operating conditions, thus taking into account frequency-power and/or temperature-dependent contributions to the overall uncertainty from test system components. Those of skill in the art will appreciate that other factors affecting measurement uncertainty may be present, and that frequency, power, and operating temperature are merely exemplary.

For example, the power measurement accuracy of a receiver might be greater at one input power than another, or the accuracy and/or repeatability of a source might be better at one frequency than another. Performing the simulations different operating conditions with the appropriate values entered into the model provides different uncertainty distributions for the same topological model.

The DUT 12 is modeled as an amplifier with ten dB of gain ($S_{21}$=dbpolar(10,0)), perfect input match ($S_{11}$=polar(0,0)), perfect output match ($S_{22}$=polar(0,180)), and infinite reverse isolation ($S_{12}$=0). When modeling an actual test system and DUT, the s-parameters, and the ranges and distributions of the s-parameters, would typically be non-zero values. This exemplary model is highly simplified for purposes of illustration.

Similarly, the second transmission line 56 is modeled as having an impedance of fifty ohms (with no variability), and an electrical length of ninety degrees (with no variability), i.e., the second transmission line is modeled as a perfect transmission line for simplicity of illustration. The measurement receiver 24 includes a noise source 60 and a fifty-ohm termination ($R_L$) 62. The noise component is modeled as a signal source providing a second 1 GHz signal that varies ±0.01 V around 0.0 volts in a Gaussian fashion. Thus, the test system model 52 can handle many types of sources of potential uncertainty, such as impedance mismatch, variations in electrical length, generated noise, temperature and/or aging drift of the test instruments, and known (either specified or measured) repeatability and accuracy of the test instruments. Simulators can also handle non-linearities, and easily handle complex topologies, including test system components in the simulator model that might be ignored in a manual uncertainty calculation. The values chosen in the test system model are merely for purposes of illustration.

In particular, the mismatches of switches, cables, connector ends, and similar low-variation components tend to be ignored when manually deriving uncertainty calculations. However, such mismatches can become important when testing DUTs at very high and ultra high frequencies. For example, an uncertainty calculation for an integrated circuit ("IC") operating at 300 MHz might need only a relatively simple uncertainty calculation, but a similar IC operating at several GHz might need a much more complex (complete) uncertainty calculation to accurately characterize the test system.

The simulator settings 58 are set so that 1000 iterations of the test system model 52 are run using Monte Carlo techniques to vary the four variable parameters (i.e. uncertainty terms). Generally, a Monte Carlo simulation selects variable values at random to simulate a model, named after the games of chance at the Monte Carlo casino. When you roll a die, you know that either 1, 2, 3, 4, 5, or 6 will come up, but you don't know which value will come up for any particular roll. It is similar with the uncertainty terms, which have a known range of values but an uncertain value for any event (e.g. iteration of the test system model). Monte Carlo techniques randomly generate values for variables within a probability distribution, examples of which include Gaussian, rectangular, triangular, and lognormal, and run a model (solve a problem) over and over to provide a distribution of solutions (e.g. test results). Many simulators include the ability to perform Monte Carlo analyses. Simulators can be configured to provide many different types of information, such as yield to a specification. In this case, the gain of the amplifier (DUT 12) is the parameter of interest, so the YIELD and YIELD SPEC are set so that all results (solutions) from the 1000 iterations are saved (i.e. all iterations "pass"). More information on entering circuit models and setting simulator parameters is found in the ADS Characterization and Modeling Handbook, available from AGILENT TECHNOLOGIES, INC.

A harmonic balance analysis is done for the first order (i.e. fundamental) frequency, which is 1 GHz. Uncertainty analysis could also be done for the harmonic frequencies, and in the case where the DUT is a mixer, on the mixing products and harmonics of the mixing products. Monte Carlo analyses are independent of the underlying circuit simulation technology, so embodiments of the invention can be used with other types of simulation engines, such as time-domain, circuit envelope, or system-level simulators, for example. In further embodiments, different types of measurements on the same DUT use different types of simulation engines, the types of simulation engines being chosen to best match the type of measurement being evaluated.

With the four variable parameters (V of the signal source 14, Z of the first transmission line 54, E of the first transmission line 54, and V of the noise source 60), the simulator ran 1000 iterations in approximately one second on an 800 MHz personal computer. The simulator can display the results in a variety of formats, and can display any of a variety of selected parameters. The voltage output of the amplifier is the parameter used in this example to illustrate determining measurement uncertainty.

Figure 3:
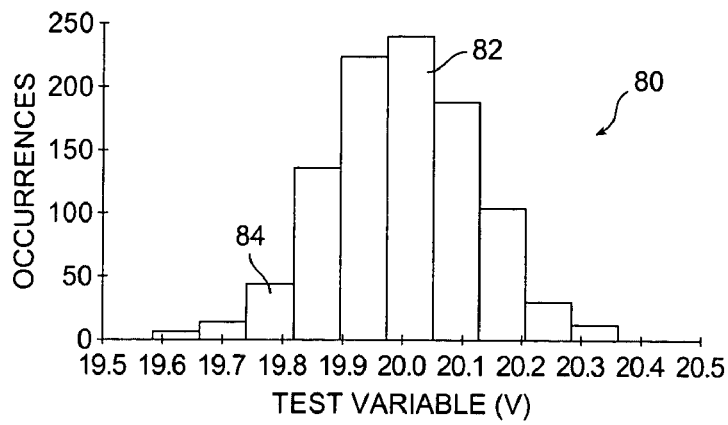
FIG. 3 is a histogram illustrating the results returned from operating the circuit simulator of FIG. 2.

FIG. 3 is a histogram 80 illustrating the results returned from operating the circuit simulator of FIG. 2. A histogram is one of several ways to display the probability distribution of the solutions (results) of the iterations. A ten dB voltage gain corresponds to a twenty-times increase in voltage. In other words, ten dB of gain increases a 1 V signal to a 20 V signal. Thus, the test variable (output voltage from the amplifier on a linear scale) is centered around 20 volts. The histogram shows how many solutions fall within each range. For example, about 245 of the 1000 iterations resulted in an output voltage solution within range 80. About 50 of the 1000 iterations resulted in an output voltage solution within range 84.

Many statistical values may be calculated from the solutions generated by the 1000 iterations of the simulator. For example, the mean and standard deviation of the 1000 solutions are calculated. Standard deviations provide an indication of what percentage of occurrences will fall within a window. If the quantity in question is modeled by a normal probability distribution, there are no finite limits that will contain 100% of its possible values. However, plus and minus 3 standard deviations about the mean of a normal distribution corresponds to 99.73% limits. Measurement uncertainties are easily calculated from the probability distribution generated by the simulator. Various limits could be determined, such as what limits would include 95% of the solutions. In other words, provide a 95% confidence level (certainty) that the selected parameter (e.g. gain) would fall within the limits. In some instances, such as where greater precision or confidence is required, more iterations are performed. Generally, enough iterations are run to produce a statistically significant sample. The number of iterations that provide statistical significance vary depending on many factors, and can be empirically determined, if necessary, by running different numbers of iterations and comparing the statistical values, for example.

IV. Exemplary Methods

Figure 4:
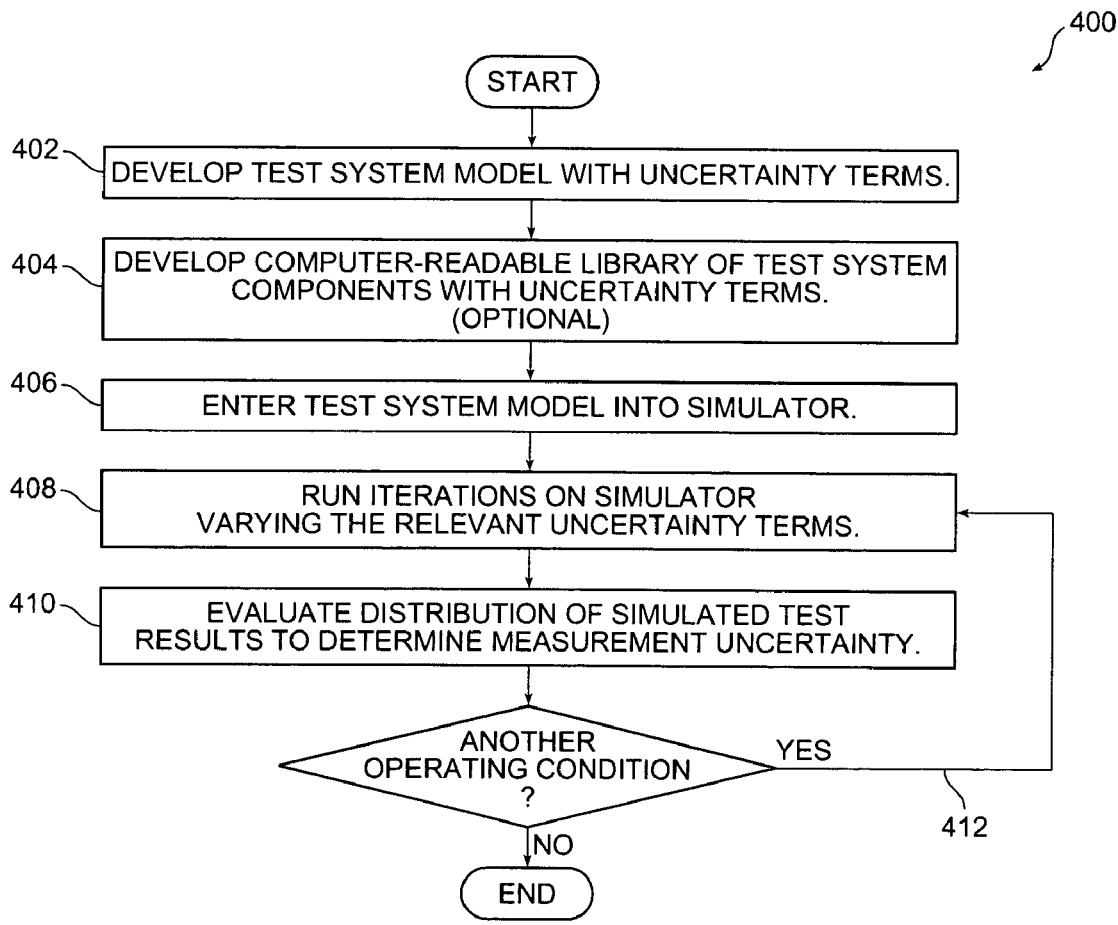
FIG. 4 is a simplified flow chart of a method of determining measurement uncertainties according to an embodiment of the present invention.

FIG. 4 is a simplified flow chart of a method of determining measurement uncertainties according to an embodiment of the present invention. A model of a test system ("test system model") including a plurality of uncertainty terms is developed (step 402). Optionally, a computer-readable library of test system components, such as instruments, cables, and switches, with their associated uncertainty terms, is developed (step 404). The test system model is entered into a simulator (step 406). In a particular embodiment, entering the test system model into the simulator includes automatically loading uncertainty terms associated with test system components from the computer-readable library.

A sufficient number of iterations are run on the simulator varying each of a first portion of the plurality of uncertainty terms to produce a statistically significant number of results of a selected parameter (step 408). The first portion of the plurality of uncertainty terms are those uncertainty terms in the test system model that are relevant to the selected test result that is being simulated. There is usually no reason to vary the other uncertainty terms, such as uncertainty terms for instruments or paths that not used when simulating the selected the selected parameter. The results are evaluated to determine a measurement uncertainty of the selected parameter (step 410). Some embodiments automatically calculate the measurement uncertainty from the distribution of results.

In some embodiments, the selected parameter and hence measurement uncertainty is evaluated at a first operating condition of the test system or DUT, such as at a particular frequency, gain, DUT bias point, or power into or out of the DUT. In a further embodiment, the selected parameter is re-evaluated at a second operating condition (branch 412).

While the preferred embodiments of the present invention have been illustrated in detail, it should be apparent that modifications and adaptations to these embodiments might occur to one skilled in the art without departing from the scope of the present invention as set forth in the following claims.

What is claimed is:

1. A method of determining a measurement uncertainty of a selected parameter of a device under test (DUT) when measured by a test system, the combination of said test system and said DUT comprising a plurality of components, each component being characterized by one of a corresponding plurality of values, each value varying in accordance with one of a corresponding plurality of expected probability distributions, said method comprising:
providing a test system model for the combination of said test system and said DUT, said model having a plurality of model elements that affect said measurement uncertainty, each model element representing one of said plurality of components and being characterized by a corresponding one of said plurality of values;
entering the test system model into a simulator;
running a sufficient number of iterations of the test system model on the simulator while randomly varying each of a first portion of the plurality of values within said corresponding probability distributions to produce a statistically significant number of results of the selected parameter; and
evaluating the results to determine the measurement uncertainty of the selected parameter of said DUT; wherein the test system model includes a test fixture comprising a plurality of switches and a plurality of cables.

2. The method of claim 1 wherein the simulator uses a harmonic balance simulation engine to produce the results.

3. The method of claim 1 wherein the simulator uses a time-domain simulation engine to produce the results.

4. The method of claim 1 wherein the simulator uses a linear S-parameter simulation engine to produce the results.

5. The method of claim 1 wherein the plurality of probability distributions includes a noise term that represents variations in noise generated by a corresponding component in said combination of said test system and said DUT, said variations in noise being characterized by a corresponding one of said probability distributions.

6. The method of claim 1 wherein the plurality of probability distributions includes a test instrument uncertainty term for a test instrument in the test system.

7. The method of claim 6 wherein the test instrument uncertainty term is selected from the group consisting of a temperature drift uncertainty term, an aging drift uncertainty term, an accuracy uncertainty term, and a repeatability uncertainty term.

8. The method of claim 1 wherein the test system model includes a test instrument as a device under test.

9. The method of claim 1 wherein the step of running occurs at a first operating condition and further comprising steps of:
running a sufficient number of iterations of the test system model on the simulator at a second operating condition while randomly varying each of the first portion of the plurality of uncertainty terms within probability distributions to produce a statistically significant number of second results of the selected parameter; and
evaluating the second results to determine a second measurement uncertainty of the selected parameter.

10. The method of claim 1 wherein the step of running is done using a first type of simulation engine and further comprising steps of:
running a second sufficient number of iterations of the test system model on the simulator using a second type of simulation engine while randomly varying each of the first portion of the plurality of uncertainty terms within probability distributions to produce a statistically significant number of second results of a second selected parameter; and
evaluating the second results to determine a second measurement uncertainty of the second selected parameter.

11. The method of claim 1 further comprising a step of developing a computer-readable library of test system components with uncertainty terms, and wherein the step of entering the test system model into the simulator includes loading uncertainty terms associated with the test system components from the computer-readable library.

12. The method of claim 1 wherein the step of providing the test system model includes automatically generating system specifications.

13. A method of determining a measurement uncertainty of a test system comprising:
developing a test system model having a plurality of uncertainty terms;
entering the test system model into a simulator;
running a sufficient number of iterations of the test system model on the simulator while randomly varying each of a first portion of the plurality of uncertainty terms within probability distributions to produce a statistically significant number of results of a selected parameter; and
evaluating the results to determine a measurement uncertainty of the selected parameter;
wherein the test system model includes a device under test and the step of running the sufficient number of iterations provides a first frequency to the device under test, and the results of the selected parameter are at a second frequency.

14. The method of claim 13 wherein the second frequency is a harmonic of the first frequency.

15. The method of claim 13 wherein the second frequency is a mixing product of the first frequency and a third frequency.

16. A method of determining a measurement uncertainty of a test system comprising:
developing a test system model having a plurality of uncertainty terms;
entering the test system model into a simulator;
running a sufficient number of iterations of the test system model on the simulator while randomly varying each of a first portion of the plurality of uncertainty terms within probability distributions to produce a statistically significant number of results of a selected parameter; and
evaluating the results to determine a measurement uncertainty of the selected parameter;
wherein the test system model includes a test fixture comprising a plurality of switches and a plurality of cables.

* * * * *

UNITED STATES PATENT AND TRADEMARK OFFICE
CERTIFICATE OF CORRECTION

| | | |
|---|---|---|
| PATENT NO. | : 7,848,911 B2 | Page 1 of 1 |
| APPLICATION NO. | : 10/783645 | |
| DATED | : December 7, 2010 | |
| INVENTOR(S) | : Daniel L. Pleasant | |

It is certified that error appears in the above-identified patent and that said Letters Patent is hereby corrected as shown below:

On the Title page, in field (75), in "Inventor", in column 1, line 1, delete "Daniel L. Plesant," and insert -- Daniel L. Pleasant, --, therefor.

On the Title page, in field (56), under "Other Publications", in column 2, line 4, delete "Argilent" and insert -- Agilent --, therefor.

Signed and Sealed this
Nineteenth Day of April, 2011

David J. Kappos
*Director of the United States Patent and Trademark Office*